(12) United States Patent
Harada et al.

(10) Patent No.: US 11,116,106 B2
(45) Date of Patent: Sep. 7, 2021

(54) COOLING DEVICE, COOLING SYSTEM, AND METHOD OF COOLING

(71) Applicant: FUJITSU LIMITED, Kawasaki (JP)

(72) Inventors: Shinobu Harada, Shizuoka (JP); Youichi Yokota, Mishima (JP); Keita Hirai, Kawasaki (JP); Shinnosuke Fujiwara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/776,556

(22) Filed: Jan. 30, 2020

(65) Prior Publication Data

US 2020/0267872 A1 Aug. 20, 2020

(30) Foreign Application Priority Data

Feb. 14, 2019 (JP) .............................. JP2019-024218

(51) Int. Cl.
*H05K 7/20* (2006.01)

(52) U.S. Cl.
CPC ......... *H05K 7/20236* (2013.01); *H05K 7/208* (2013.01); *H05K 7/2039* (2013.01); *H05K 7/20245* (2013.01); *H05K 7/20272* (2013.01); *H05K 7/20336* (2013.01); *H05K 7/20772* (2013.01)

(58) Field of Classification Search
CPC ....................... H05K 7/20245; H05K 5/20236
See application file for complete search history.

(56) References Cited

U.S. PATENT DOCUMENTS

| 3,200,881 | A | * | 8/1965 | Bucks | F25D 31/00 |
| | | | | | 165/104.21 |
| 3,432,357 | A | * | 3/1969 | Dankese | B01D 47/00 |
| | | | | | 429/434 |
| 3,858,090 | A | * | 12/1974 | Lehmann | H05K 7/20236 |
| | | | | | 361/699 |
| 3,888,730 | A | * | 6/1975 | Jackson | G21C 1/03 |
| | | | | | 376/290 |
| 6,145,584 | A | * | 11/2000 | Baynes | F28D 15/02 |
| | | | | | 165/45 |
| 7,362,574 | B2 | * | 4/2008 | Campbell | H01L 23/4735 |
| | | | | | 361/699 |

(Continued)

FOREIGN PATENT DOCUMENTS

| EP | 2487326 A1 * | 8/2012 | ........... E21B 47/017 |
| EP | 2487327 A1 * | 8/2012 | ......... H05K 7/20927 |

(Continued)

*Primary Examiner* — Robert J Hoffberg
(74) *Attorney, Agent, or Firm* — Fujitsu Patent Center

(57) ABSTRACT

A cooling device includes: an inner tank configured to store a first coolant which is a liquid; a separation wall that is provided in the inner tank, that faces a side wall portion of the inner tank, that forms an accommodating portion in which an electronic device to be immersed in the first coolant is accommodated, and that forms, at at least part of a periphery of the accommodating portion, a coolant channel through which the first coolant is to flow toward a lower side of the inner tank; an outer tank which is disposed outside the inner tank and through which a second coolant flows; and a heat transfer unit that is provided between the inner tank and the outer tank and that is configured to transfer heat from the first coolant to the second coolant.

5 Claims, 17 Drawing Sheets

(56) References Cited

U.S. PATENT DOCUMENTS

| | | | | |
|---|---|---|---|---|
| 7,375,962 | B2* | 5/2008 | Campbell | H01L 23/4735 361/699 |
| 7,580,261 | B2* | 8/2009 | Smith | H01L 23/4735 165/104.33 |
| 9,258,926 | B2* | 2/2016 | Smith | H05K 7/20818 |
| 9,573,104 | B2* | 2/2017 | Rijfers | B05B 1/04 |
| 10,219,415 | B2* | 2/2019 | Wiley | H05K 7/2079 |
| 10,240,845 | B2* | 3/2019 | Smith | F25D 1/00 |
| 10,257,963 | B2* | 4/2019 | Ozyalcin | H05K 7/20236 |
| 10,321,609 | B2* | 6/2019 | Hirai | H05K 7/20236 |
| 10,568,234 | B1* | 2/2020 | Mao | H05K 7/20236 |
| 10,716,238 | B2* | 7/2020 | Brink | H05K 7/20263 |
| 10,775,858 | B2* | 9/2020 | Mao | H01M 10/613 |
| 10,847,440 | B2* | 11/2020 | Chang | H05K 7/20236 |
| 2014/0352928 | A1* | 12/2014 | Huang | H05K 7/20236 165/104.31 |
| 2017/0223870 | A1* | 8/2017 | Smith | F25D 3/00 |
| 2018/0153058 | A1* | 5/2018 | Hirai | H05K 7/20781 |
| 2018/0235107 | A1* | 8/2018 | Wiley | H05K 7/20236 |
| 2018/0343770 | A1* | 11/2018 | Brink | H05K 7/20245 |
| 2019/0219311 | A1* | 7/2019 | Smith | H05K 7/20272 |
| 2019/0357385 | A1* | 11/2019 | Miyazaki | F28F 9/005 |

FOREIGN PATENT DOCUMENTS

| | | | |
|---|---|---|---|
| JP | 04170097 A * | 6/1992 | H05K 7/20236 |
| JP | 2010-016049 A | 1/2010 | |
| WO | 2018/087904 A1 | 5/2018 | |

\* cited by examiner

COOLING DEVICE, COOLING SYSTEM, AND METHOD OF COOLING

CROSS-REFERENCE TO RELATED APPLICATION

This application is based upon and claims the benefit of priority of the prior Japanese Patent Application No. 2019-24218, filed on Feb. 14, 2019, the entire contents of which are incorporated herein by reference.

FIELD

The embodiments discussed herein are related to a cooling device, a cooling system, and a method of cooling.

BACKGROUND

Various devices that cool heat generating bodies such as electronic devices have been proposed. For example, a known ebullient cooling device includes an accommodating part and a condensing part. The accommodating part accommodates a liquid coolant subjected to heat of a heat generating body. The condensing part communicates with the accommodating part and condenses the liquid coolant boiling due to the heat of the heat generating body. There also is a known immersion cooling device that cools an electronic device when the electronic device generating heat is immersed in a coolant stored in a cooling tank.

Related techniques are disclosed in, for example, Japanese Laid-open Patent Publication No. 2010-16049 and International Publication Pamphlet No. WO 2018/087904.

Nowadays, with the advent of an advanced information society, demand for data centers is significantly increasing. In a data center, a large number of racks are installed indoors, and electronic devices such as servers and storage devices are housed in racks so as to be collectively controlled. As electronic devices increase in performance, the amount of heat generated by the electronic devices increases. High-density mounting of electronic devices generating a large amount of heat may increase the temperature of the electronic devices, causing malfunction, failure, or reduction in processing capacity. Accordingly, there exists a demand for a cooling device and a cooling method with which the electronic devices generating large amounts of heat are able to be sufficiently cooled even when such electronic devices are highly densely mounted. In order to address such a demand, the ebullient cooling device or the immersion cooling device described above may be used.

However, since the above-described ebullient cooling device utilizes ebullient cooling, a space where a coolant having been gasified by boiling is condensed (liquefied) is required. Thus, there is a concern about an increase in a size of the cooling device. Although the above-described immersion cooling device has been practically used in data centers, there is room for further improvement as follows.

For example, in a related-art immersion cooling device, an inert liquid coolant having a high insulating property, for example, a fluorine compound or the like fills the immersion tank. An electronic device is immersed in the coolant, and the coolant circulates by using a pump between the immersion tank and a coolant distribution unit (CDU). Thus, the amount of the coolant required for cooling the electronic device immersed in the liquid immersion tank is about an amount filling the total of the volume of the immersion tank, the volume of a coolant circulating unit in the CDU, and the volume of channels of the piping coupling the immersion tank and the CDU to each other.

The coolant desirably used in the Immersion cooling device is expensive, and as the amount of coolant increases, the cost increases correspondingly. Since the specific gravity of the coolant is larger than that of water, when the amount of the coolant increases, the degree of requirement for reinforcement of the floor where the immersion cooling device is installed increases. As described above, when the amount of the coolant increases, it is conceivable that various inconveniences occur. In the above-described immersion cooling device, an inlet opening for a cooling liquid (coolant) and an outlet for the cooling liquid are provided in the cooling tank. Thus, it is conceivable that the cooling liquid is circulated between the cooling tank and the outside of the cooling tank. This may cause similar inconveniences.

SUMMARY

According to an aspect of the embodiments, a cooling device includes: an inner tank configured to store a first coolant which is a liquid; a separation wall that is provided in the inner tank, that faces a side wall portion of the inner tank, that forms an accommodating portion in which an electronic device to be immersed in the first coolant is accommodated, and that forms, at at least part of a periphery of the accommodating portion, a coolant channel through which the first coolant is to flow toward a lower side of the inner tank; an outer tank which is disposed outside the inner tank and through which a second coolant flows; and a heat transfer unit that is provided between the inner tank and the outer tank and that is configured to transfer heat from the first coolant to the second coolant.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
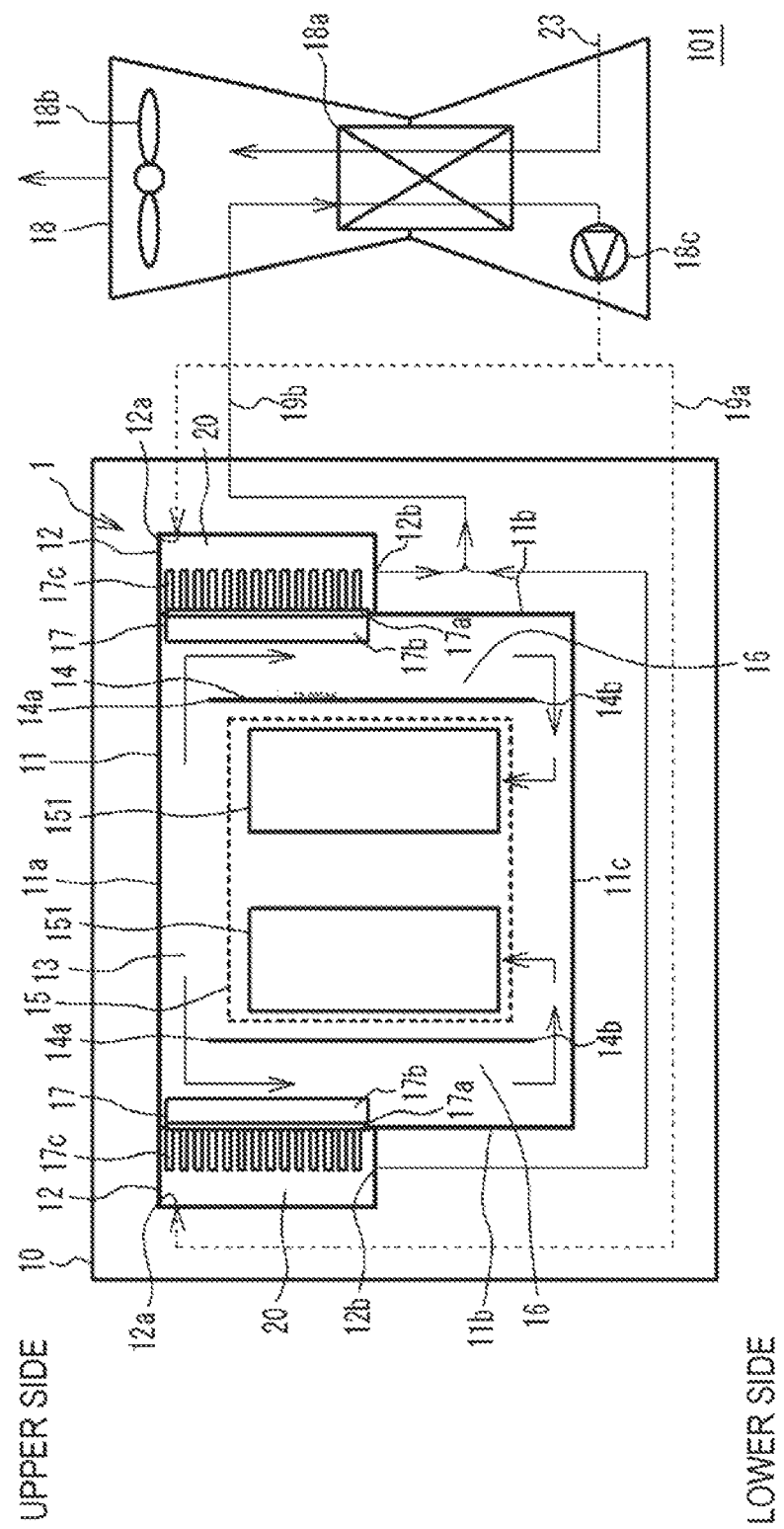
FIG. 1 schematically illustrates a configuration of a cooling system according to a first embodiment.

Hereinafter, embodiments will be described with reference to the drawings. In the drawings, the dimensions, ratios, and the like of parts are not necessarily illustrated to be completely consistent with those of the actual parts. Also in some drawings, for convenience of description, elements actually present are omitted or the elements are exaggerated in dimensions compared to the actual elements. Upper and lower sides of a cooling system 101 are set in the direction illustrated in FIG. 1. The up-down direction herein coincides with the vertical direction.

First Embodiment

First, referring to FIGS. 1 to 38, the cooling system 101 and a cooling device 1 according to a first embodiment are described. The cooling system 101 according to the first embodiment includes the cooling device 1 installed in a server room 10 and electronic devices 151 disposed in the cooling device 1 and to be cooled by the cooling device 1. The electronic devices 151 are information processing devices. For example, the electronic devices 151 are servers. Objects to be cooled by the cooling device 1 are not limited to the servers. Storage devices or the like that generate heat and that are required to be cooled may be the objects to be cooled by the cooling device 1.

The cooling device 1 includes an inner tank 11, an outer tank 12, a first coolant 13, separation walls 14, a coolant channel 16, heat sinks 17, and an external cooling device 18 corresponding to an external cooling unit. The cooling device 1 is an immersion cooling device in which the electronic devices 151 are immersed in the first coolant 13.

The inner tank 11 includes a top plate portion 11a, side wall portions 11b, and a bottom plate portion 11c. The top plate portion 11a, the side wall portions 11b, and the bottom plate portion 11c are formed of a thermally insulating material. The first coolant 13 may be, for example, a liquid and stored in the inner tank 11. The electronic device 151 is immersed in the first coolant 13. The first coolant 13 may be, for example, a fluorine-based insulating coolant that is an inert fluorine compound having an insulating property. Although Fluorinert (trademark of Minnesota Mining and Manufacturing Company (3M)) manufactured by 3M is used according to the present embodiment, a coolant used in a related-art immersion cooling device may be used. The cooling device 1 according to the present embodiment has a rectangular shape in a plan view. Also, the external shape of the inner tank 11 is a rectangular shape with four side wall portions 11b. However, the external shape of the inner tank 11 is not limited to a rectangular shape and may be any of various shapes. The top plate portion 11a, the side wall portions 11b, and the bottom plate portion 11c of the inner tank 11 may have a hollow structure to improve a thermally insulating property.

Figure 2:
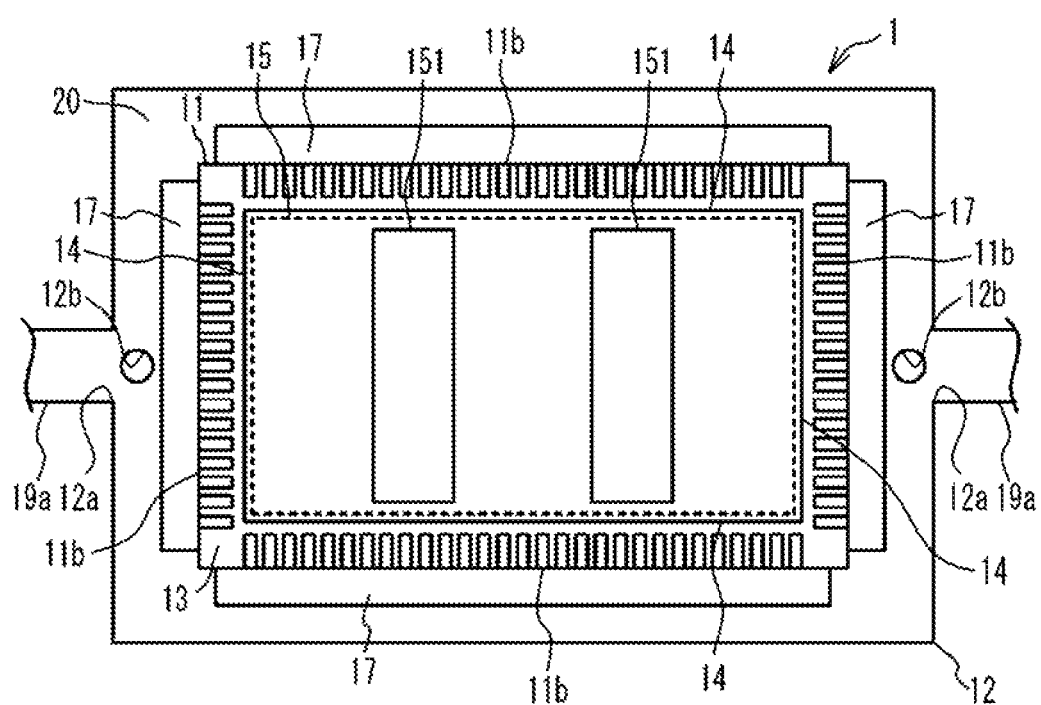
FIG. 2 is a plan view of a region where an inner tank and an outer tank included in the cooling system according to the first embodiment are disposed.

The outer tank 12 is formed of a thermally insulating material and disposed outside the inner tank 11. Referring to FIG. 2, the outer tank 12 surrounds an upper portion of the inner tank 11 at least above a level at half the height of the inner tank 11. The outer tank 12 covers an entire periphery of the four side wall portions 11b of the inner tank 11 disposed such that the side wall portions 11b form a rectangular shape in a plan view. A second coolant 20 flows in the outer tank 12. The second coolant 20 may be, for example, water. The second coolant 20 exchanges heat with the first coolant 13 to cool the first coolant 13. The outer tank 12 may also have a hollow structure to improve a thermally insulating property. When the outer tank 12 has a thermally insulating structure, the second coolant 20 is unlikely to be influenced by temperature outside the outer tank 12. This may improve the cooling capacity of the cooling device 1.

The outer tank 12 is coupled to the external cooling device 18 through a first pipe 19a and a second pipe 19b. As illustrated in FIG. 1, the external cooling device 18 includes a heat exchange unit 18a and a fan 18b. The external cooling device 18 causes heat to be exchanged between an external coolant 23 and the second coolant 20 at the heat exchange unit 18a to cool the second coolant 20. According to the present embodiment, the external coolant 23 is outside air. The external coolant 23 having been heated when cooling the second coolant 20 is released to the atmosphere by the fan 18b. A pump 18c is disposed in the first pipe 19a to introduce the second coolant 20 having been cooled by the external cooling device 18 into the outer tank 12. The second coolant 20 having been heated by the heat exchange with the first coolant 13 is discharged from the outer tank 12 through the second pipe 19b. The position where the first pipe 19a is coupled to the outer tank 12, for example, an introduction position 12a where the second coolant 20 is introduced into the outer tank 12 is disposed above the position where the second pipe 19b is coupled to the outer tank 12, for example, a discharge position 12b where the second coolant 20 is discharged from the outer tank 12. The reason for this is to distribute the low-temperature second coolant 20 to a higher region in the outer tank 12.

The separation walls 14 are installed in the inner tank 11 by using, for example, brackets (not illustrated). Referring to FIG. 2, four separation walls 14 are provided corresponding to the rectangular shape of the inner tank 11. The separation walls 14 are disposed so as to face the respective side wall portions 11b of the inner tank 11. The separation walls 14 as described above form an accommodating portion 15 for the electronic devices 151. For example, the electronic devices 151 are disposed in a region surrounded by the separation walls 14. The arrangement of separation walls 14 is not limited to a rectangular arrangement. The separation walls 14 may be arranged in any of various shapes. Although the separation walls 14 have a thermally insulating structure formed of a thermally insulating material, the thermally insulating property may be improved by a hollow structure.

When the separation walls 14 are disposed so as to face the side wall portions 11b of the inner tank 11, the coolant channel 16 is formed between the separation walls 14 and the side wall portions 11b of the inner tank 11. In other words, the separation walls 14 form the coolant channel 16 around the accommodating portion 15 for the electronic devices 151. The first coolant 13 flows from an upper portion toward a lower portion through the coolant channel 16.

According to the present embodiment and as illustrated in FIG. 1, upper edge portions 14a and lower edge portions 14b of the separation walls 14 define openings. For example, the separation walls 14 arranged in a rectangular shape in a plan view are not provided with a top plate portion or a bottom plate portion, and the first coolant 13 in the accommodating portion 15 surrounded by the separation walls 14 is able to flow into the coolant channel 16 through a region between the upper edge portions 14a of the separation walls 14 and the top plate portion 11a of the inner tank 11. The first coolant 13 flowing downward through the coolant channel 16 is able to flow into the accommodating portion 15 again through a region between the lower edge portions 14b of the separation walls 14 and the bottom plate portion 11c of the inner tank 11.

The cooling device 1 according to the present embodiment allows the first coolant 13 to flow from the upper portion to the lower portion of the coolant channel 16. When the first coolant 13 is cooled, the density of the first coolant 13 increases, and accordingly, the first coolant 13 is likely to move downward. For this reason, it is desirable that the first coolant 13 be cooled at a position as high as possible in the coolant channel 16. Thus, the outer tank 12 according to the present embodiment is installed at a position where the outer tank 12 surrounds the upper portion of the inner tank 11 at least above the level at half the height of the inner tank 11.

According to the present embodiment, the separation walls 14 are disposed so as to face the side wall portions 11b of the inner tank 11. Thus, the coolant channel 16 is formed entirely around the accommodating portion 15. When the coolant channel 16 is formed entirely around the accommodating portion 15 as described above, the first coolant 13 may efficiently circulate in the inner tank 11. However, the coolant channel 16 is not necessarily formed entirely around the accommodating portion 15. It is sufficient that the coolant channel 16 is formed at at least part of the periphery of the accommodating portion 15 so as to allow the first coolant 13 to circulate in the inner tank 11.

The heated first coolant 13 is distributed in the accommodating portion 15 surrounded by the separation walls 14, and the cooled first coolant 13 flows through the coolant channel 16 outside the separation walls 14. Thus, when the separation walls 14 have a thermally insulating structure, the temperature difference may be maintained between the first coolant 13 in the accommodating portion 15 and the first coolant 13 flowing through the coolant channel 16.

Figure 3A:
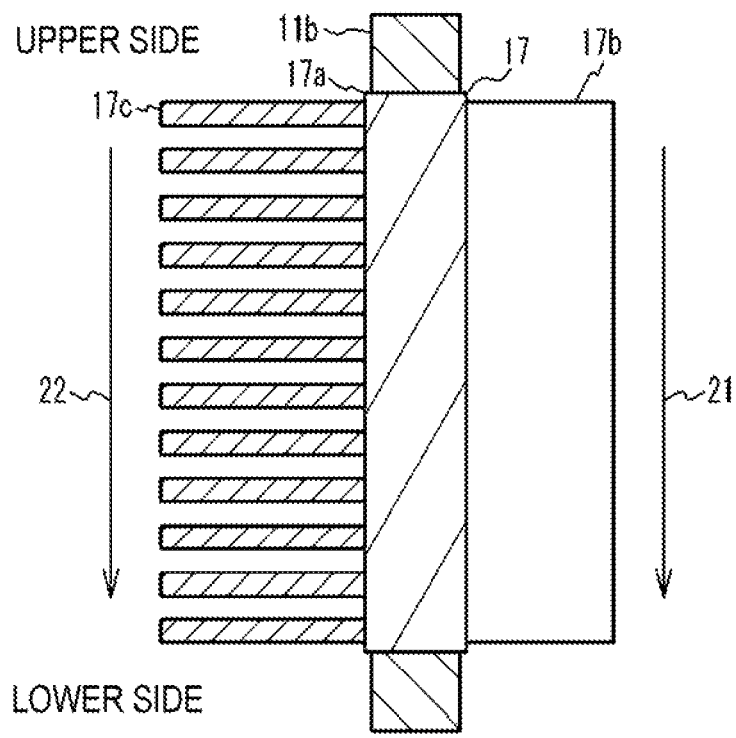
FIG. 3A is a sectional view of a region where a heat sink included in the cooling system according to the first embodiment is disposed.
Figure 3B:
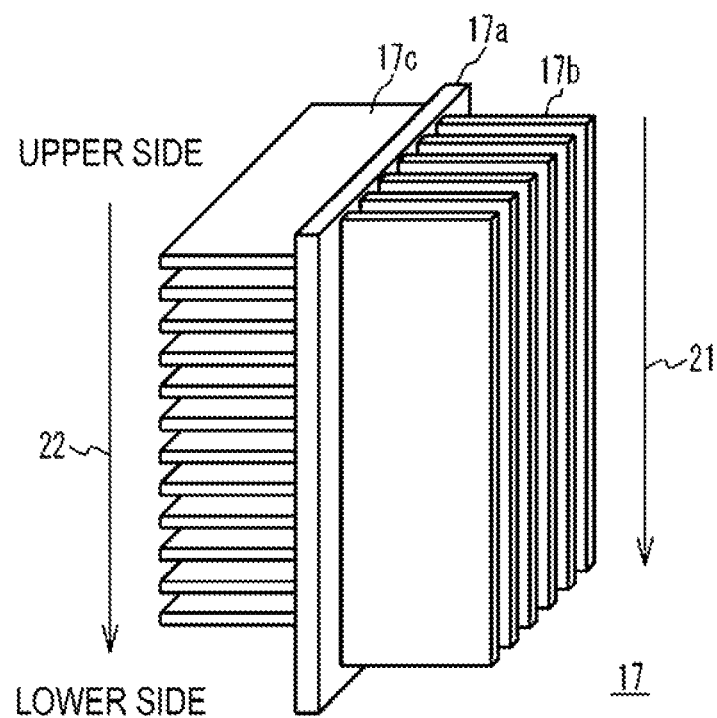
FIG. 3B is a perspective view of the heat sink included in the cooling system according to the first embodiment.

Each of the heat sinks 17 is an example of a heat transfer unit. Referring to FIGS. 3A and 3B, the heat sink 17 includes a separating plate 17a attached to the corresponding side wall portion 11b of the inner tank 11, inner fins 17b provided on one surface side of the separating plate 17a, and outer fins 17c provided on the other surface side of the separating plate 17a. As illustrated in FIGS. 1 and 2, the heat sink 17 is provided on the side wall portion 11b such that the inner fins 17b are positioned in the inner tank 11 and the outer fins 17c are positioned in the outer tank 12. The heat sink 17 causes heat to be exchanged between the first coolant 13 flowing through the coolant channel 16 and the second coolant 20 flowing through the outer tank 12. Thus, the heat sink 17 is disposed at a position where the coolant channel 16 is provided. For example, each of the heat sink 17 is provided at a corresponding one of the four side wall portions 11b.

An arrow 21 illustrated in FIGS. 3A and 3B indicates the flow direction of the first coolant 13 in the inner tank 11, and an arrow 22 indicates the flow direction of the second coolant in the outer tank 12. The first coolant 13 in the inner tank 11 flows upward through the accommodating portion 15, flows into the coolant channel 16, and flows downward through the coolant channel 16 as indicated by the arrow 21. The inner fins 17b are arranged such that the surfaces of the inner fins 17b extends along the flow of the first coolant 13. The second coolant 20 in the outer tank 12 flows in from the introduction position 12a provided on the upper side of the outer tank 12 and flows toward the discharge position 12b provided on the lower side of the outer tank 12. The outer fins 17c are provided such that the second coolant 20 strikes the surfaces of the outer fins 17c and easily carries away the heat. The shapes and arrangement of the inner fins 17b and the outer fins 17c as described above are not limited to the above description and may be changed in various manners. Although the heat sink 17 is formed of aluminum, the heat sink 17 may be formed of, for example, copper or any other material having good thermal conductivity. Although a plurality of the inner fins 17b and a plurality of the outer fins 17c are provided according to the present embodiment, the numbers of the inner fins 17b and the outer fins 17c may be appropriately set.

Next, an operating state of the cooling system 101 including the cooling device 1 as described above are described. The electronic devices 151 are cooled when the cooling system 101 is operated.

First, the fan 18b and the pump 18c included in the external cooling device 18 are operated. As a result, the second coolant 20 flows into the outer tank 12 through the first pipe 19a. The second coolant 20 flowing through the outer tank 12 passes through the heat exchange unit 18a included in the external cooling device 18 through the second pipe 19b and is fed to the outer tank 12 again by the pump 18c. The external coolant 23 that exchanges heat with the second coolant 20 in the heat exchange unit 18a is released to the atmosphere by the fan 18b.

When the electronic devices 151 accommodated in the accommodating portion 15 provided in the inner tank 11 is started to operate, the first coolant 13 in the accommodating portion 15 is heated by heat generated by the electronic devices 151. The heated first coolant 13 generates an upward flow. The first coolant 13 having reached the liquid level by the upward flow is divided into four directions toward the outside of the accommodating portion 15, flows along the side wall portions 11b of the inner tank 11, and flows into the coolant channel 16 provided around the accommodating portion 15.

The first coolant 13 transfers heat to the inner fins 17b of the heat sinks 17. As a result, the first coolant 13 is contracted by being cooled and increased in density, thereby increasing a downward flowing force. The first coolant 13 flowing into the coolant channel 16 flows toward the lower side of the inner tank 11. The first coolant 13 is easily drawn into the coolant channel 16 when a force of the first coolant 13 flowing through the coolant channel 16 increases.

The first coolant 13 that has flowed toward the lower side of the inner tank 11 and struck the bottom plate portion 11c of the inner tank 11 flows toward a region below the accommodating portion 15. The coolant channel 16 is defined by the side wall portions 11b of the inner tank 11 and the separation walls 14. Thus, the flow of the first coolant 13 that has flowed through the coolant channel 16 and struck the bottom plate portion 11c is blocked by the side wall portions 11b and flows toward the region below the accommodating portion 15 positioned at or near the center of the inner tank 11.

The first coolant 13 in the accommodating portion 15 continuously generates an upward flow due to the heat generated by the electronic devices 151. Thus, the first coolant 13 having flowed into the region below the accommodating portion 15 through the coolant channel 16 is drawn into the accommodating portion 15 again. Then, the first coolant 13 is heated by the heat generated by the electronic devices 151 and generates the upward flow again.

As described above, the first coolant 13 generates natural convection due to the heat generated by the electronic devices 151. The first coolant 13 circulates in the inner tank 11 when an increase in temperature due to the heat generated by the electronic devices 151 and a reduction in temperature due to the heat sink 17 repeatedly occur. For example, the cooling device 1 does not require special power for circulating the first coolant 13 in the inner tank 11.

For increasing a force to circulate the first coolant 13 in the inner tank 11, it is desirable that the difference in temperature distribution of the first coolant 13 in the inner tank 11 be large. The separation walls 14 according to the present embodiment have the thermally insulating structure. Thus, the temperature difference may be maintained between the first coolant 13 in the accommodating portion 15 and the first coolant 13 flowing through the coolant channel 16. Accordingly, the force to circulate the first coolant 13 may be increased, and the first coolant 13 may be smoothly circulated.

The heat having been transmitted to the inner fins 17b is transmitted to the outer fins 17c through the separating plate 17a. The heat having been transmitted to the outer fins 17c is carried away by the second coolant 20. The heat having been carried away by the second coolant 20 is discharged to the atmosphere by the external cooling device 18. The external cooling device 18 is not necessarily operated before operation of the electronic devices 151. For example, it is sufficient that the external cooling device 18 be operated at timing at which the electronic devices 151 are able to be appropriately cooled.

As has been described, since the cooling system 101 according to the present embodiment intentionally circulates the first coolant 13 in the inner tank 11, a coolant distribution unit (CDU) is not required. Accordingly, pipes coupling the CDU to an immersion tank storing the first coolant 13 are not required, either. As a result, the first coolant 13 is reduced by an amount filling the total of the volume of a coolant circulating unit in the CDU and the volume of channels in the pipes coupling the CDU to the immersion tank. Thus, the amount of the first coolant 13 required for operating the cooling device 1 is reduced. This may reduce the cost and weight. The CDU or the pipes extending from the CDU are not required, either. This may also reduce the cost and weight. As a result of the weight reduction of the cooling system 101, reinforcement of the floor for installing the cooling system 101 or the space for installing the CDU is not required. This may also reduce the cost.

Since a pump for circulating the first coolant 13 is not required, maintenance work for the pump is not required. The power for operating the pump is not required, either. Since the pump for circulating the first coolant 13 is not provided, noise caused when the pump is operated is not generated.

Second Embodiment

Figure 4:
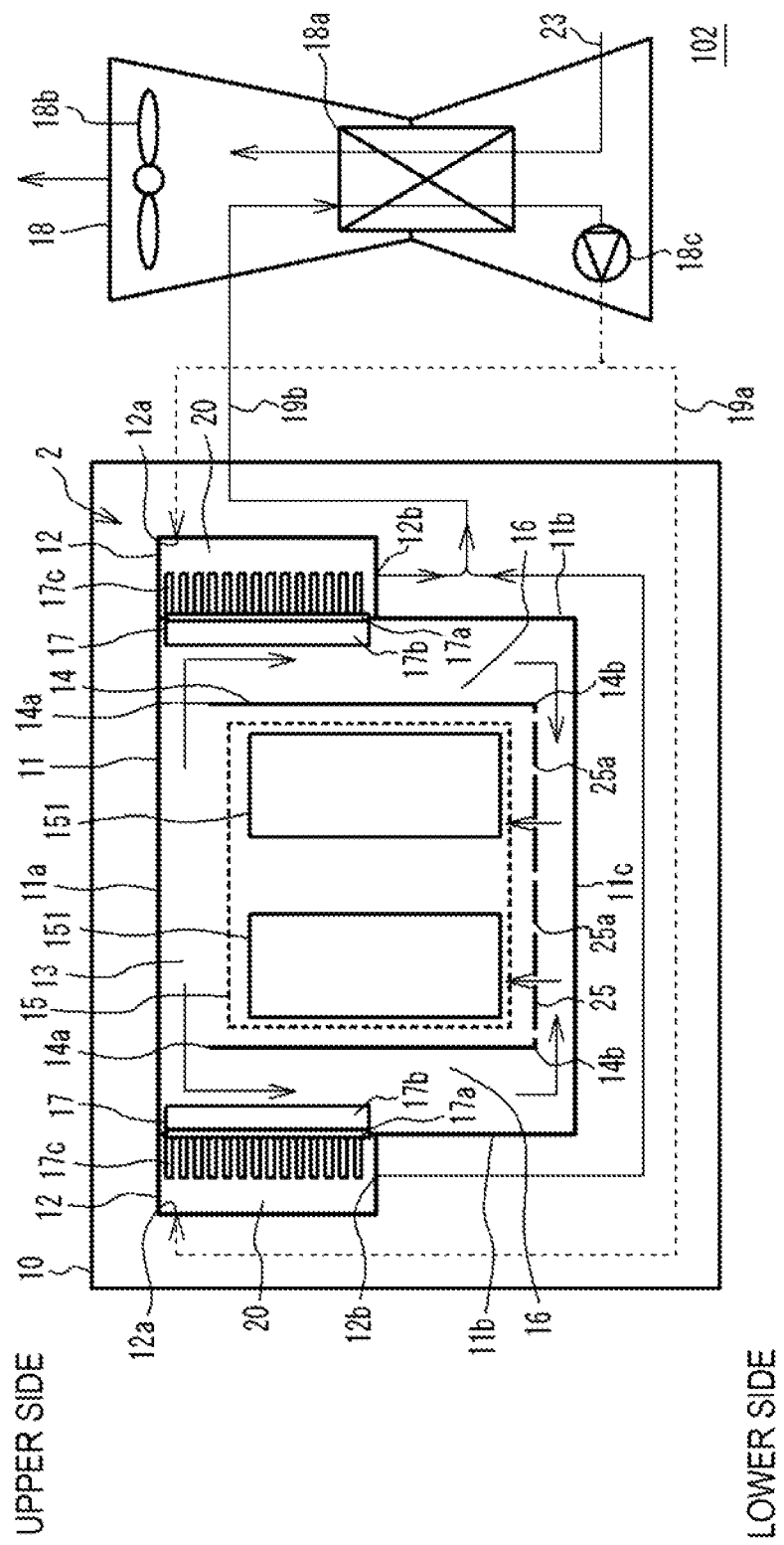
FIG. 4 schematically illustrates a configuration of a cooling system according to a second embodiment.
Figure 5:
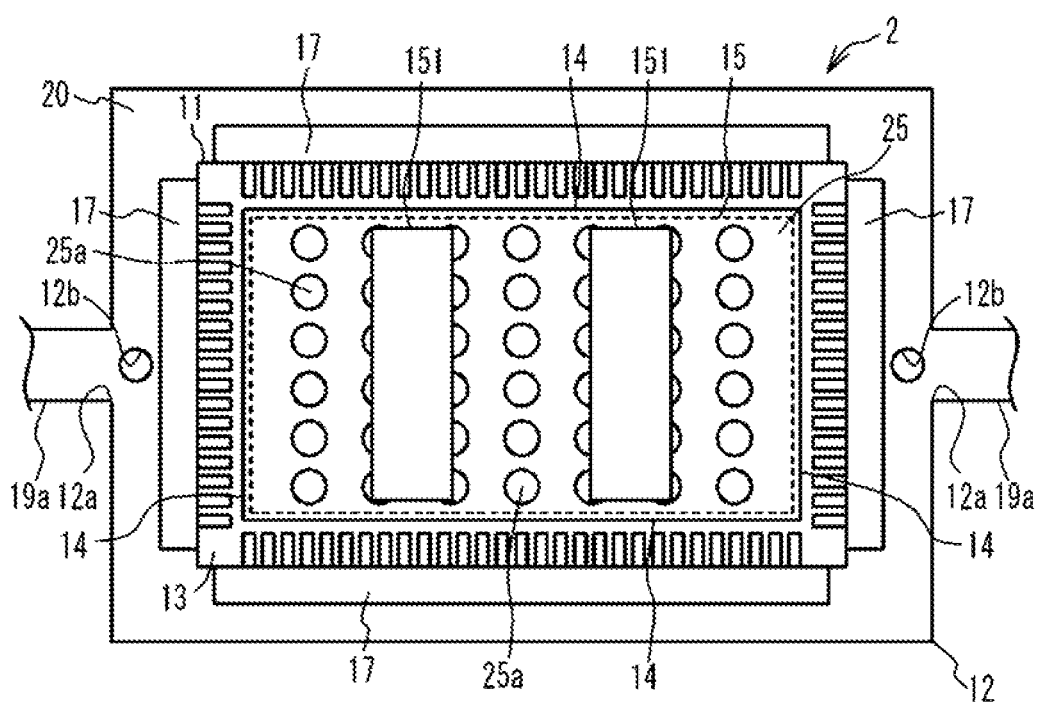
FIG. 5 is a plan view of a region where the inner tank and the outer tank included in the cooling system according to the second embodiment are disposed.

Next, referring to FIGS. 4 and 5, a cooling system 102 and a cooling device 2 according to a second embodiment are described. The difference between the first embodiment and the second embodiment is that, according to the second embodiment, the cooling device 2 includes a bottom plate 25 that is disposed below the accommodating portion 15 and has injection holes 25a through which the first coolant 13 having flowed to a region below the accommodating portion 15 through the coolant channel 16 is injected toward the accommodating portion 15. Since other elements are not different from those of the first embodiment, common elements are denoted by the same reference numerals in the drawings, and detailed description thereof is omitted.

The cooling device 2 included in the cooling system 102 includes the bottom plate 25 that covers the lower end of the accommodating portion 15 formed by arranging the separation walls 14 in a rectangular shape. The bottom plate 25 is continuous with the lower edge portions 14b of the separation walls 14. The bottom plate 25 has the injection holes 25a that allow communication between the inside of the accommodating portion 15 and the region below the accommodating portion 15. A thermally insulating structure is also used for the bottom plate 25.

The first coolant 13 having passed through the coolant channel 16 and flowed into the region below the accommodating portion 15 passes through the injection holes 25a and is injected into the accommodating portion 15. When the first coolant 13 is passed through the injection holes 25a, the force of the flow of the first coolant 13 increases. When the force of the first coolant 13 increases as described above, the first coolant 13 may easily circulate in the inner tank 11. When the bottom plate 25 is provided, the difference in temperature between the accommodating portion 15 and the periphery of the accommodating portion 15 may be easily maintained. This may also increase the force of the circulation of the first coolant 13.

Third Embodiment

Figure 6:
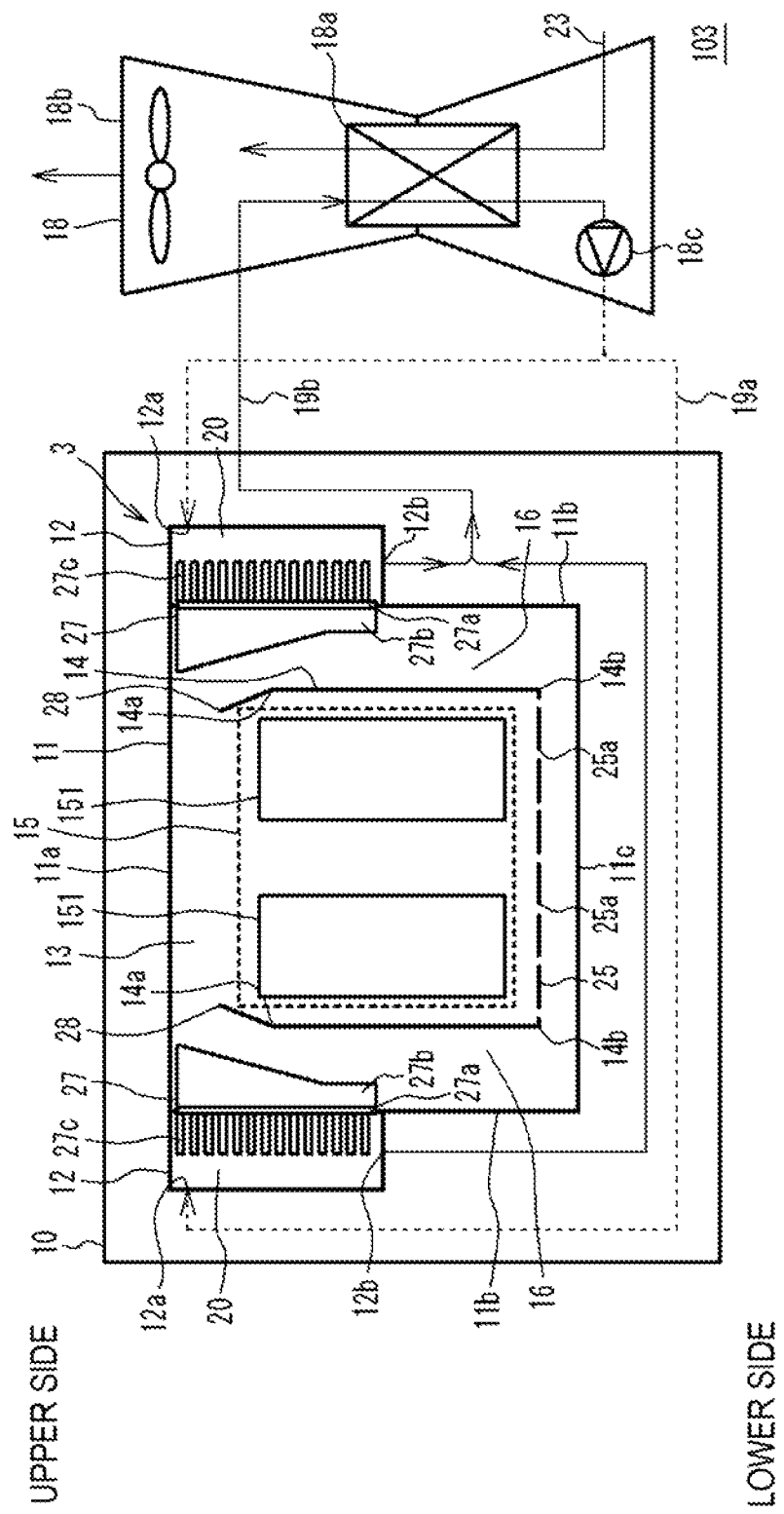
FIG. 6 schematically illustrates a configuration of a cooling system according to a third embodiment.
Figure 7A:
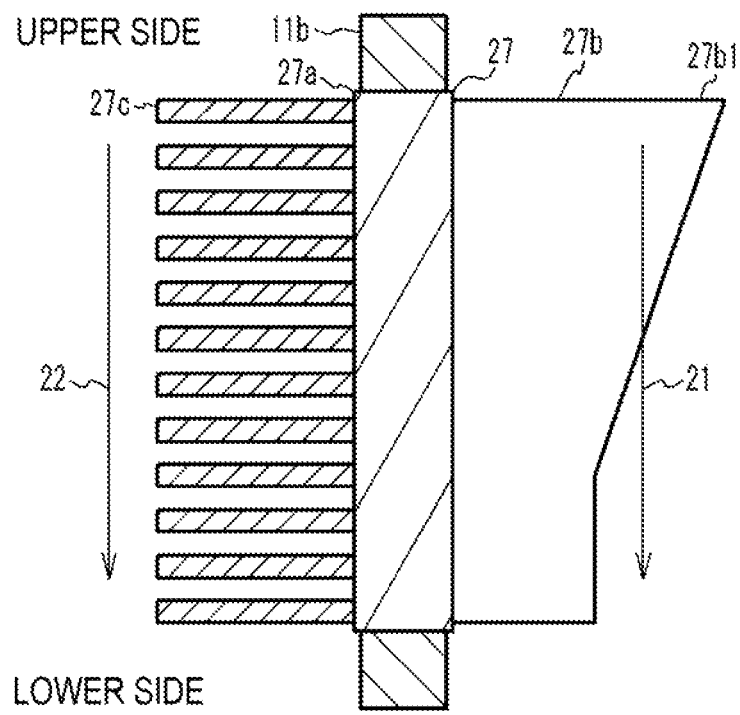
FIG. 7A is a sectional view of a region where a heat sink included in the cooling system according to the third embodiment is disposed.
Figure 7B:
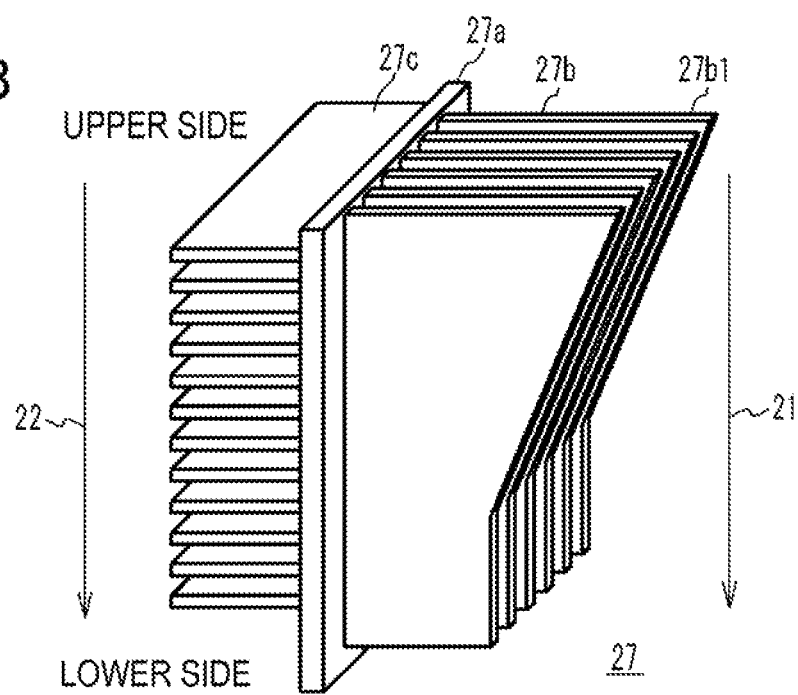
FIG. 7B is a perspective view of the heat sink included in the cooling system according to the third embodiment.

Next, referring to FIGS. 6, 7A, and 78, a cooling system 103 and a cooling device 3 according to a third embodiment are described. According to the third embodiment, heat sinks 27 are provided instead of the heat sinks 17. Also according to the third embodiment, the upper edge portions 14a of the separation walls 14 each have a guide plate portion 28 inclined toward a central portion of the inner tank 11 as the guide plate portion 28 extends upward. The third embodiment is different from the second embodiment in the above-described points. Since other elements are not different from those of the second embodiment, common elements are denoted by the same reference numerals in the drawings, and detailed description thereof is omitted.

The heat sinks 27 each include a separating plate 27a, inner fins 27b, and outer fins 27c similarly to the heat sink 17 according to the first embodiment and the second embodiment. However, the distance between the separating plate 27a and a side edge of each of the inner fins 27b is larger in an upper portion of the inner fin 27b than in a lower portion of the inner fin 27b, and an area enlarged portion 27b1 is formed in the upper portion of the inner fin 27b.

When the area enlarged portion 27b1 is provided in the upper portion of the inner fin 27b as described above, heat may be efficiently lost from the first coolant 13 that is heated by heating of the electronic devices 151 in the accommodating portion 15 and flows into the coolant channel 16. Thus, the first coolant 13 may be effectively cooled. When the first coolant 13 is cooled, the density of the first coolant 13 increases. This increases the downward flowing force. Thus, when heat exchange with the first coolant 13 is performed at a position in the inner fin 27b as high as possible to cool the first coolant 13, the force of the flow of the first coolant 13 is able to increase in an upper region of the inner tank 11. As the force of the flow of the first coolant 13 in the upper region of the inner tank 11 increases, the force of the flow of the first coolant 13 drawn from the accommodating portion 15 into the coolant channel 16 also increases. As a result, the force with which the first coolant 13 circulates in the inner tank 11 increases and the speed at which the first coolant 13 circulates increases. This may improve cooling efficiency.

The area enlarged portion 27b1 according to the present embodiment has a triangular shape in which the distance between the separating plate 27a and the side edge of the inner fin 27b increases toward an upper edge of the inner fin 27b. However, the shape of the area enlarged portion 27b1 is not limited to this and may be any of various shapes.

The guide plate portion 28 gradually reduces the size of a channel directed from the accommodating portion 15 toward the coolant channel 16. Thus, the first coolant 13 having generated the upward flow in the accommodating portion 15 may be efficiently introduced into the coolant channel 16. For example, the guide plate portion 28 is able to increase the force of the flow of the first coolant 13 drawn from the accommodating portion 15 into the coolant channel 16.

According to the present embodiment, the guide plate portion 28 and the area enlarged portion 27b1 are provided, and, due to synergistic effect of these, the force of the flow of the first coolant is able to be further increased. However, a form in which either the guide plate portion 28 or the area enlarged portion 27b1 is employed may be used.

Fourth Embodiment

Figure 8:
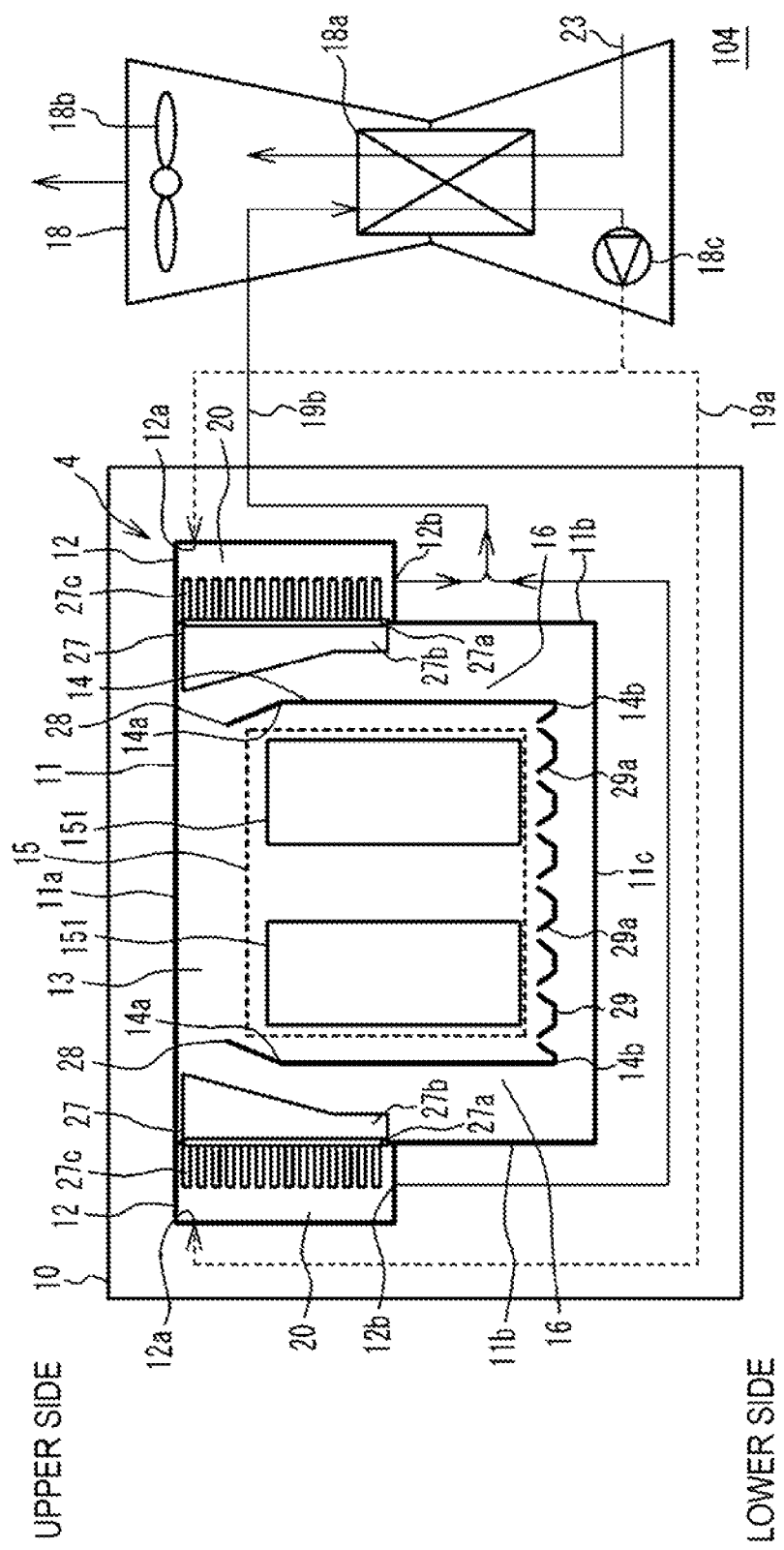
FIG. 8 schematically illustrates a configuration of a cooling system according to a fourth embodiment.
Figure 9:
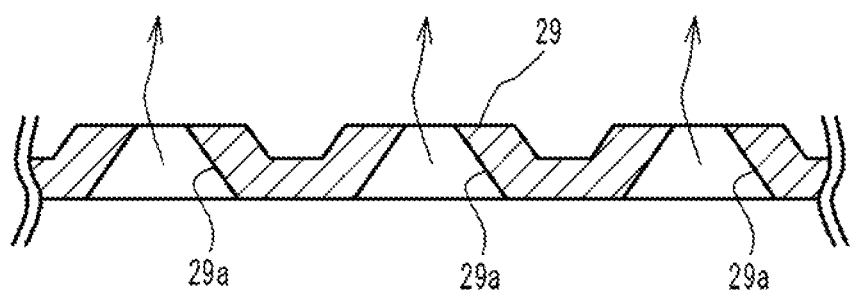
FIG. 9 is a sectional view of part of a bottom plate included in the cooling system according to the fourth embodiment.

Next, referring to FIGS. 8 and 9, a cooling system 104 and a cooling device 4 according to a fourth embodiment are described. According to the fourth embodiment, a bottom plate 29 is provided instead of the bottom plate 25 according to the third embodiment. Since other elements are not different from those of the third embodiment, common elements are denoted by the same reference numerals in the drawings, and detailed description thereof is omitted.

The bottom plate 29 has injection holes 29a. The injection holes 29a are each tapered such that the diameter of the injection hole 29a reduces from a lower surface side of the bottom plate 29, for example, from the outside of the accommodating portion 15 toward an upper surface side, for example, toward the inside the accommodating portion 15. This increases the force of the first coolant 13 injected through the injection hole 29a, and the speed at which the first coolant 13 flows increases. As a result, the force with which the first coolant 13 circulates in the inner tank 11 increases, and the speed at which the first coolant 13 circulates increases. This may improve the cooling efficiency.

Fifth Embodiment

Figure 10:
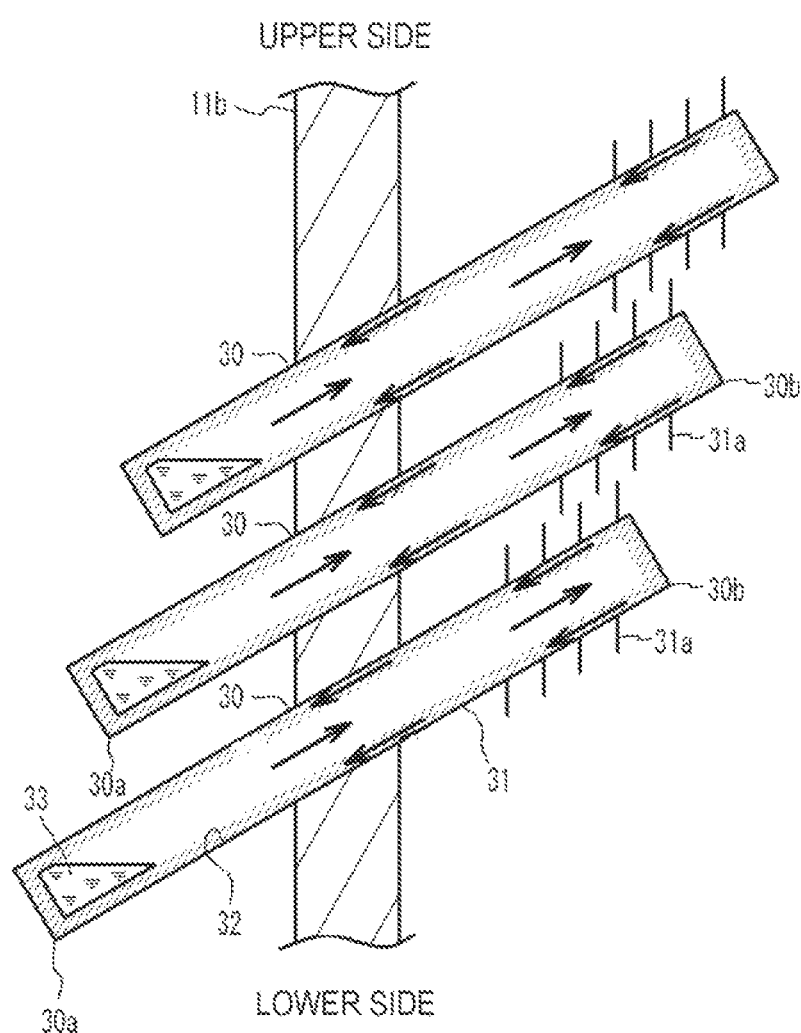
FIG. 10 is a sectional view of heat pipes according to a fifth embodiment.
Figure 11:
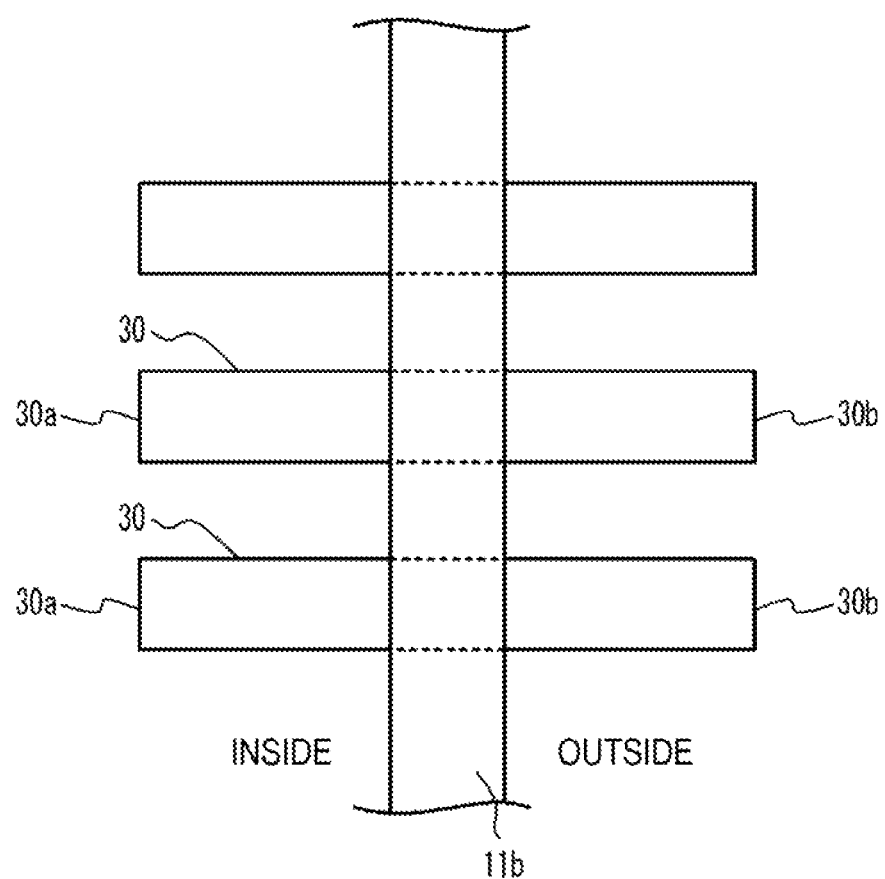
FIG. 11 is a plan view illustrating arrangement of the heat pipes according to the fifth embodiment.

Next, referring to FIGS. 10 and 11, a fifth embodiment is described. According to the fifth embodiment, heat pipes 30 are provided instead of the heat sinks 17 according to the first embodiment or the heat sinks 27 according to the third embodiment. The heat pipes 30 each serve as an example of the heat transfer unit.

A plurality of the heat pipes 30 are provided. The heat pipes 30 penetrate through the side wall portions 11b and are arranged in the up-down direction and the left-right direction. Each of the heat pipes 30 is disposed such that a first end portion 30a is located inside the side wall portion 11b, for example, in the inner tank 11, and a second end portion 30b is located outside the side wall portion 11b, for example, in the outer tank 12.

Referring to FIG. 10, the heat pipe 30 includes a cylindrical hollow case 31 closed at both ends. Although the hollow case 31 is formed of aluminum having high thermal conductivity, the hollow case 31 may be formed of a material other than aluminum having high thermal conductivity such as copper. Heat dissipation fins 31a are provided on an outer circumferential surface at the second end portion 30b side of the hollow case 31. Although it is not provided according to the present embodiment, a heat absorbing fin may be provided on the outer peripheral surface at the first end portion 30a side of the hollow case 31.

A wick 32 is provided on an inner circumferential wall of the hollow case 31. The wick 32 causes a capillary phenomenon and has fine irregularities. The wick 32 may be formed of a porous membrane formed of a collection of fine particles.

A hydraulic fluid 33 is enclosed in the hollow case 31. The inside of the hollow case 31 is depressurized to facilitate evaporation of the hydraulic fluid 33. Although the hydraulic fluid 33 is water according to the present embodiment, alcohol or the like may be used.

The heat pipe 30 is obliquely disposed such that the first end portion 30a inside the inner tank 11 where the temperature becomes high is located at a lower level than the level of the second end portion 30b. As a result, the hydraulic fluid 33 in a liquid state is accumulated on the first end portion 30a side. When the first end portion 30a side is heated by the first coolant 13, the hydraulic fluid 33 accumulated on the first end portion 30a side is evaporated to become gas. At this time, the hydraulic fluid 33 deprives surroundings of heat of vaporization.

The hydraulic fluid 33 having been gasified at the first end portion 30a moves toward the second end portion 30b side which becomes a low temperature side through a central portion of the heat pipe 30. Then, the hydraulic fluid 33 is cooled by using the second coolant 20 on the second end portion 30b side and condenses to return to a liquid. At this time, the hydraulic fluid 33 dissipates heat of condensation. The hydraulic fluid 33 having been liquefied on the second end portion 30b side moves toward the first end portion 30a side through the wick 32 due to the capillary phenomenon.

As described above, the hydraulic fluid 33 moves between the first end portion 30a side and the second end portion 30b side of the heat pipe 30 while repeatedly being evaporated (gasified) and condensed (liquefied), thereby transporting the heat from the first end portion 30a side to the second end portion 30b side.

In this way, with the heat pipe 30, the first coolant 13 is able to be cooled by using the second coolant 20. Since the operations of the other elements are not different from those of the first embodiment and so forth, detailed description thereof is omitted.

Sixth Embodiment

Figure 12:
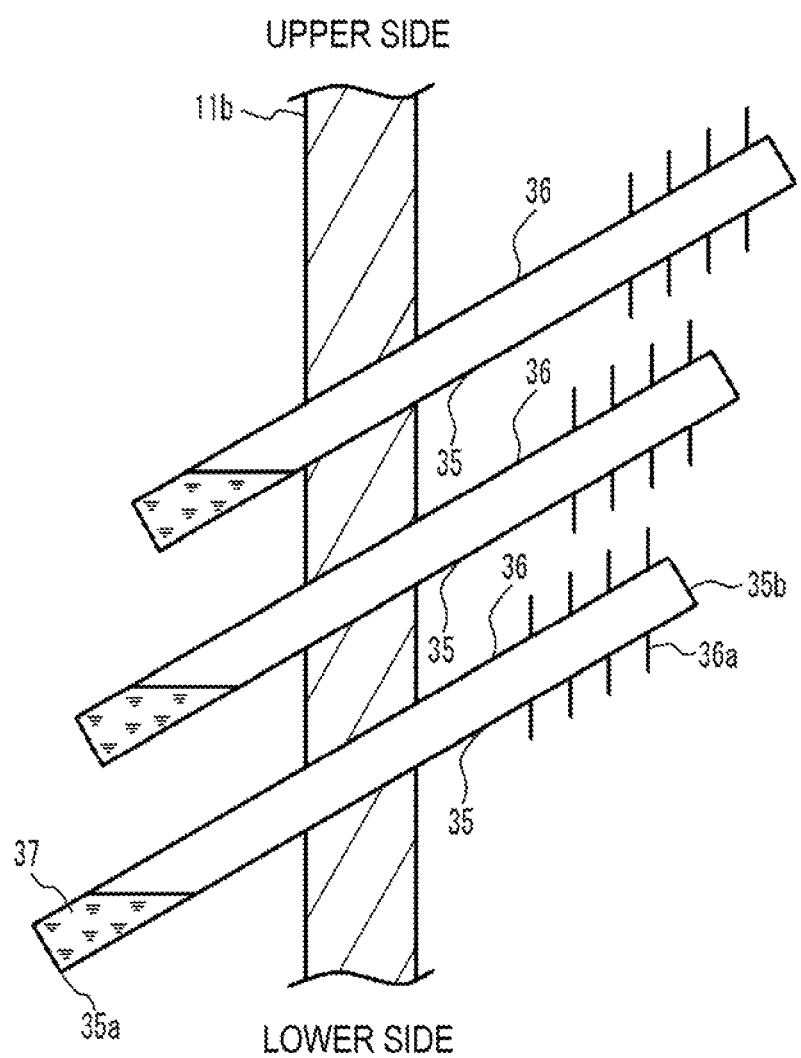
FIG. 12 is a sectional view of a region where heat siphons are disposed according to a sixth embodiment.

Next, referring to FIG. 12, a sixth embodiment is described. According to the sixth embodiment, heat siphons 35 are provided instead of the heat sinks 17 according to the first embodiment or the heat sinks 27 according to the third embodiment. The heat siphons 35 each serve as an example of the heat transfer unit.

A plurality of the heat siphons 35 are provided. The heat siphons 35 are arranged in the up-down direction and the left-right direction and penetrate through the side wall portions 11b. Each of the heat siphons 35 is disposed such that a first end portion 35a is located inside the side wall portion 11b, for example, in the inner tank 11, and a second end portion 35b is located outside the side wall portion 11b, for example, in the outer tank 12.

Referring to FIG. 12, the heat siphon 35 includes a cylindrical hollow case 36 closed at both ends. Although the hollow case 36 is formed of aluminum having high thermal conductivity, the hollow case 36 may be formed of a material other than aluminum having high thermal conductivity such as copper. Heat dissipation fins 36a are provided on an outer circumferential surface at the second end portion 35b side of the hollow case 36. Although it is not provided according to the present embodiment, a heat absorbing fin may be provided on the outer peripheral surface at the first end portion 35a side of the hollow case 36.

A hydraulic fluid 37 is enclosed in the hollow case 36. The inside of the hollow case 36 is depressurized to facilitate evaporation of the hydraulic fluid 37. Although the hydraulic fluid 37 is water according to the present embodiment, alcohol or the like may be used.

The heat siphon 35 is obliquely disposed such that the first end portion 35a inside the inner tank 11 where the temperature becomes high is located at a lower level than the level of the second end portion 35b. As a result, the hydraulic fluid 37 in a liquid state is accumulated on the first end portion 35a side. When the first end portion 35a side is heated by the first coolant 13, the hydraulic fluid 37 accumulated on the first end portion 35a side is evaporated to become gas. At this time, the hydraulic fluid 37 deprives surroundings of heat of vaporization.

The hydraulic fluid 37 having been gasified at the first end portion 35a moves toward the second end portion 35b side which becomes a low temperature side through an inner space of the heat siphon 35. Then, the hydraulic fluid 37 is cooled by using the second coolant 20 on the second end portion 35b side and condenses to return to a liquid. At this time, the hydraulic fluid 37 dissipates heat of condensation. The hydraulic fluid 37 having been liquefied on the second end portion 35b side moves toward the first end portion 35a along an inner circumferential surface of the hollow case 36.

As described above, the hydraulic fluid 37 moves between the first end portion 35a side and the second end portion 35b side of the heat siphon 35 while repeatedly being evaporated (gasified) and condensed (liquefied), thereby transporting the heat from the first end portion 35a side to the second end portion 35b side.

In this way, with the heat siphon 35, the first coolant 13 is able to be cooled by using the second coolant 20. Since the operations of the other elements are not different from those of the first embodiment and so forth, detailed description thereof is omitted.

Seventh Embodiment

Figure 13:
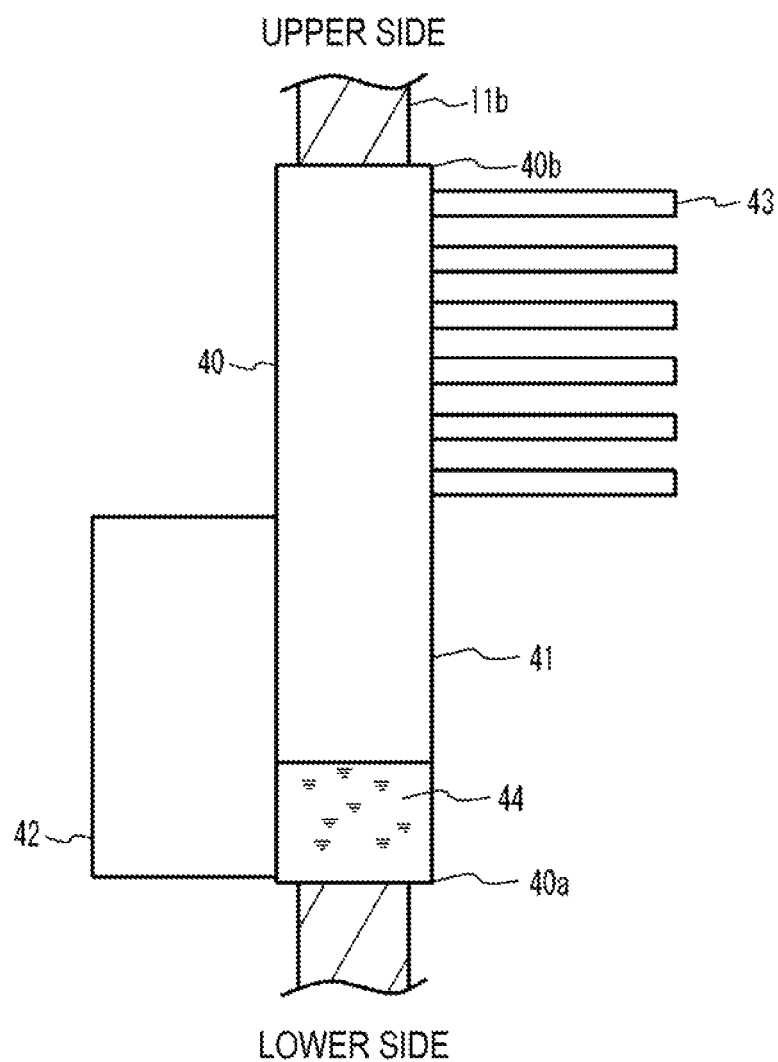
FIG. 13 is a sectional view of a region where a vapor chamber is disposed according to a seventh embodiment.

Next, referring to FIG. 13, a seventh embodiment is described. According to the seventh embodiment, vapor chambers 40 are provided instead of the heat sinks 17 according to the first embodiment or the heat sinks 27 according to the third embodiment. The vapor chambers 40 each serve as an example of the heat transfer unit.

The vapor chambers 40 are provided in the side wall portions 11b with a first end portion 40a disposed on the lower side and a second end portion 40b disposed on the upper side.

Referring to FIG. 13, the vapor chamber 40 includes a cylindrical hollow case 41 closed at both ends. Although the hollow case 41 is formed of aluminum having high thermal conductivity, the hollow case 41 may be formed of a material other than aluminum having high thermal conductivity such as copper.

A heat absorbing fin 42 is provided in a portion of the hollow case 41 that is on the first end portion 40a side and exposed to the inside of the inner tank 11. Also, heat dissipation fins 43 are provided in a portion of the hollow case 41 that is on the second end portion 40b side and exposed to the inside of the outer tank 12.

A hydraulic fluid 44 is enclosed in the hollow case 41. The inside of the hollow case 41 is depressurized to facilitate evaporation of the hydraulic fluid 44. Although the hydraulic fluid 44 is water according to the present embodiment, alcohol or the like may be used.

The vapor chamber 40 is provided in the side wall portion 11b with the first end portion 40a disposed on the lower side and the second end portion 40b disposed on the upper side. Thus, the hydraulic fluid 44 in a liquid state is accumulated on the first end portion 40a side. The heat absorbing fin 42 is provided on the first end portion 40a side. When the heat absorbing fin 42 absorbs heat of the first coolant 13, the first end portion 40a is heated. Accordingly, the hydraulic fluid 44 accumulated on the first end portion 40a side is evaporated to become gas. At this time, the hydraulic fluid 44 deprives surroundings of heat of vaporization.

The hydraulic fluid 44 having been gasified at the first end portion 40a moves toward the second end portion 40b side through an inner space of the vapor chamber 40. The heat dissipation fins 43 are provided on the second end portion 40b side. Cooling of the second end portion 40b due to heat dissipation to the second coolant 20 performed with the heat dissipation fins 43 causes the hydraulic fluid 44 to condense to return to a liquid. At this time, the hydraulic fluid 44 dissipates the condensation heat. The hydraulic fluid 44 having been liquefied on the second end portion 40b side moves toward the first end portion 40a side along an inner circumferential surface of the hollow case 41.

As described above, the hydraulic fluid 44 moves between the first end portion 40a side and the second end portion 40b side of the vapor chamber 40 while repeatedly being evaporated (gasified) and condensed (liquefied), thereby transporting the heat from the first end portion 40a side to the second end portion 40b side.

In this way, with the vapor chamber 40, the first coolant 13 is able to be cooled by using the second coolant 20. Since the operations of the other elements are not different from those of the first embodiment and so forth, detailed description thereof is omitted.

Eighth Embodiment

Figure 14:
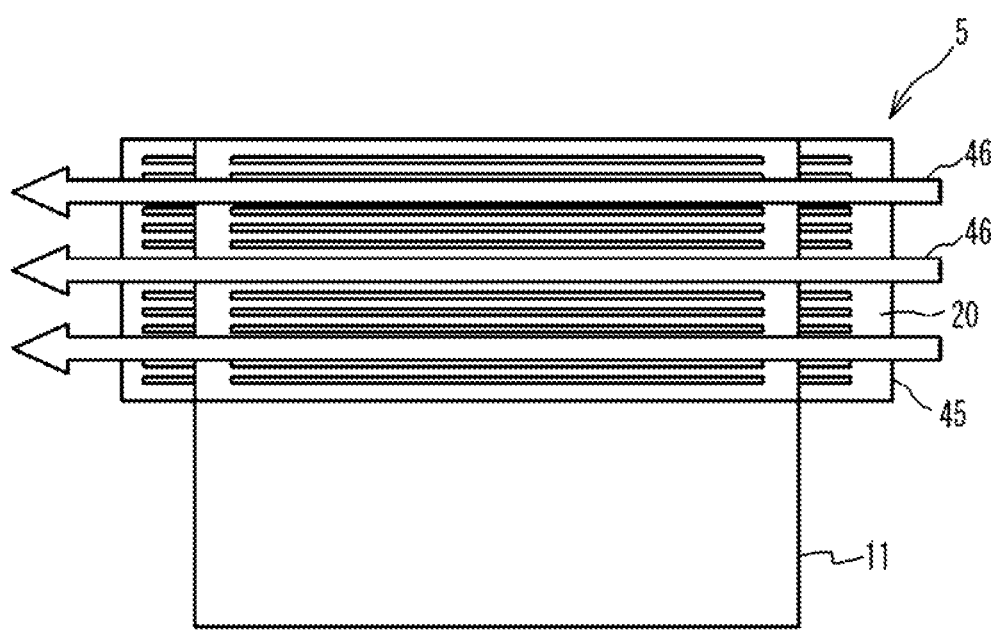
FIG. 14 schematically illustrates a flowing direction of a second coolant according to an eighth embodiment.
Figure 15:
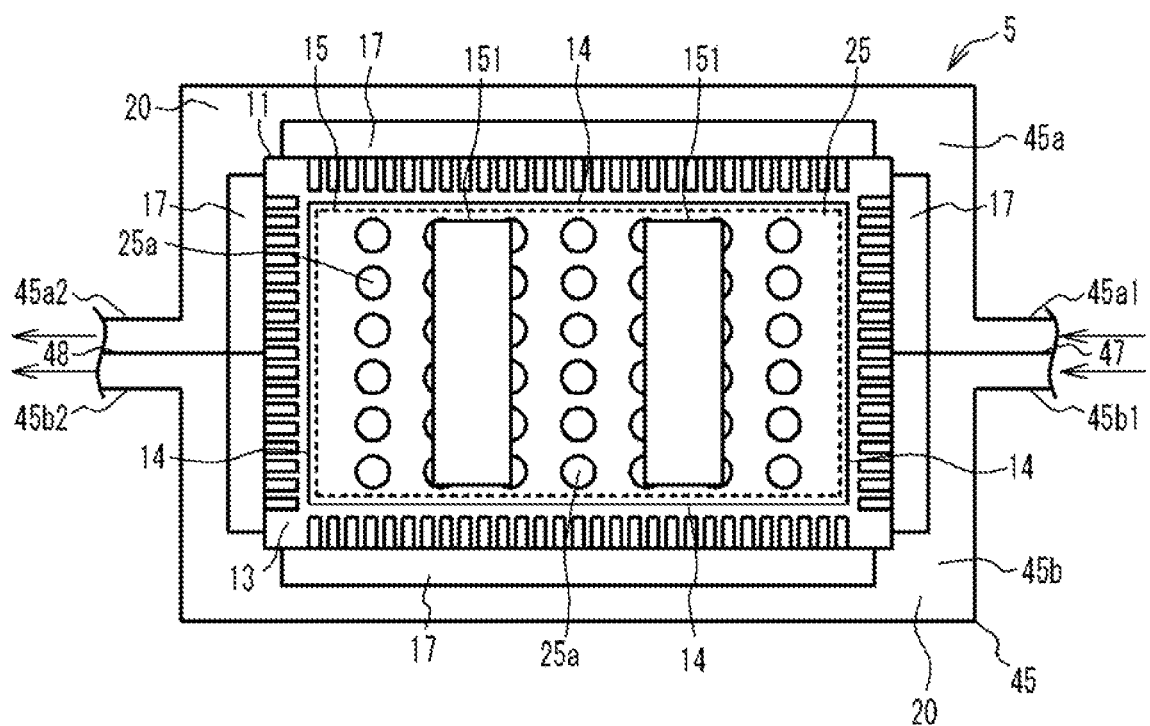
FIG. 15 illustrates how the second coolant flows according to the eighth embodiment.

Next, regarding an eighth embodiment, referring to FIGS. 14 and 15, a cooling device 5 according to the eighth embodiment is described. According to the eighth embodiment, an outer tank 45 is provided instead of the outer tank 12 according to the first embodiment. The introduction position 12a is higher than the discharge position 12b in the outer tank 12 according to the first embodiment illustrated in FIG. 1. Accordingly, the second coolant 20 is likely to flow from the upper side to the lower side in the outer tank 12. In the outer tank 45 according to the eighth embodiment, as indicated by arrows 46 illustrated in FIG. 14, the second coolant 20 flows in the lateral direction. Since other elements are not different from those of the first embodiment, common elements are denoted by the same reference numerals in the drawings, and detailed description thereof is omitted.

Referring to FIG. 15, dividing walls 47, 48 are provided in the outer tank 45 so as to divide the inside of the outer tank 45 into a first region 45a and a second region 45b. The outer tank 45 includes a first inlet 45a1 through which the second coolant 20 is introduced into the first region 45a and a first outlet 45a2 through which the second coolant 20 is discharged from the first region 45a. Also, the outer tank 45 includes a second inlet 45b1 through which the second coolant 20 is introduced into the second region 45b and a second outlet 45b2 through which the second coolant 20 is discharged from the second region 45b.

When the inside of the outer tank 45 is divided as described above and the second coolant 20 is caused to flow through the divided regions, the second coolant 20 is subjected to heat exchange within the divided small regions. Thus, the heat exchange may be effectively performed. For example, the temperature of the second coolant 20 increases as a region in which the second coolant 20 flows increases, and a cooling effect reduces toward the outlet. When the inside of the outer tank 45 is divided as is the case with the present embodiment, the temperature of the second coolant 20 may be easily maintained at a temperature appropriate for cooling. As described above, when the inside of the outer tank 45 is divided, the cooling efficiency of the first coolant 13 by using the second coolant 20 may be improved. Thus, the inside of the outer tank 45 may be further divided as is the case with, for example, the following modification.

<Modification>

Figure 16:
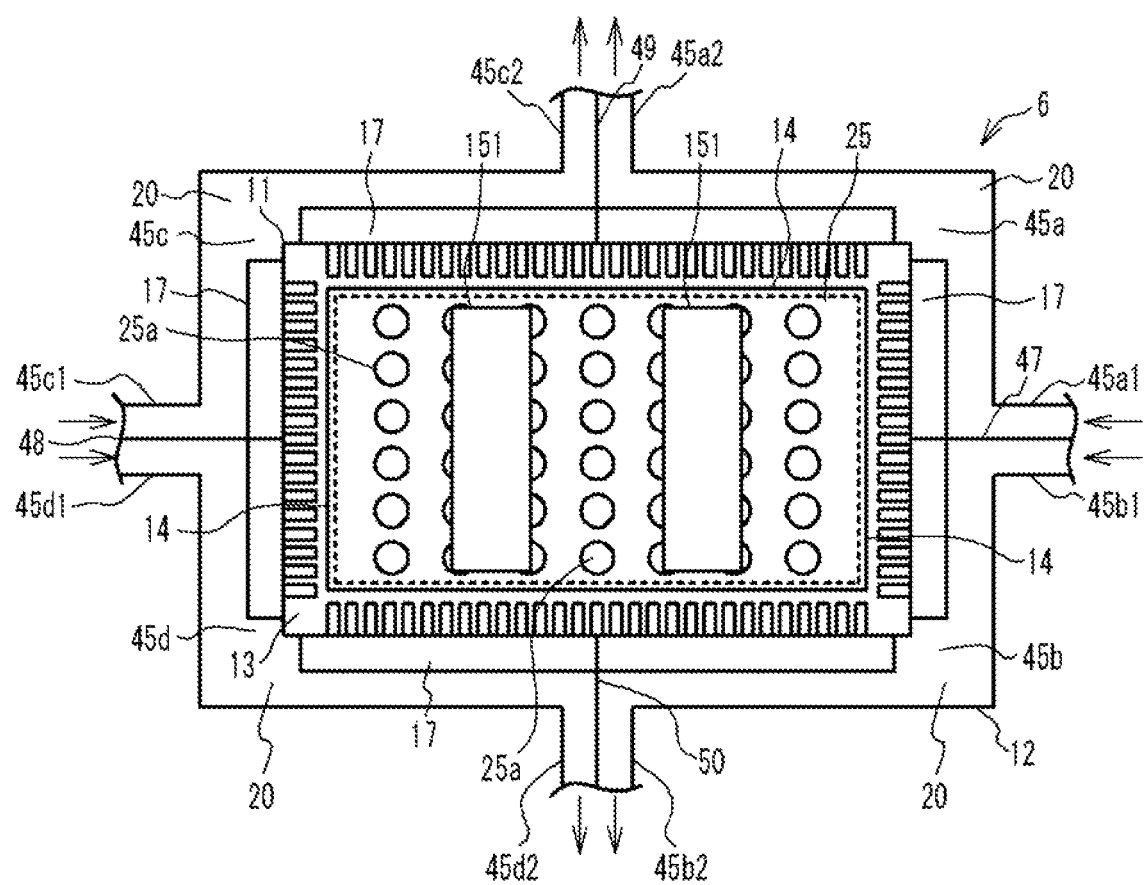
FIG. 16 illustrates a modification of the eighth embodiment.

Referring to FIG. 16, the dividing walls 47, 48 and dividing walls 49, 50 are provided in the outer tank 45 of a cooling device 6 according to a modification so as to divide the inside of the outer tank 45 into the first region 45a, the second region 45b, a third region 45c, and a fourth region 45d. The outer tank 45 includes the first inlet 45a1 through which the second coolant 20 is introduced into the first region 45a and the first outlet 45a2 through which the second coolant 20 is discharged from the first region 45a. Also, the outer tank 45 includes the second inlet 45b1 through which the second coolant 20 is introduced into the second region 45b and the second outlet 45b2 through which the second coolant 20 is discharged from the second region 45b. Also, the outer tank 45 includes a third inlet 45c1 through which the second coolant 20 is introduced into the third region 45c and a third outlet 45c2 through which the second coolant 20 is discharged from the third region 45c. Also, the outer tank 45 includes a fourth inlet 45d1 through which the second coolant 20 is introduced into the fourth region 45d and a fourth outlet 45d2 through which the second coolant 20 is discharged from the fourth region 45d.

In the form in which the inside of the outer tank 45 is divided into quarters as described above, the volume of each of the regions reduces, and the amount of heat to be treated by the second coolant 20 introduced into the region reduces. Accordingly, the cooling capacity of the entirety of the outer tank 45 may be improved.

With the outer tank 45 as described above, the first coolant 13 is able to be cooled by using the second coolant 20. Since the operations of the other elements are not different from those of the first embodiment and so forth, detailed description thereof is omitted.

Ninth Embodiment

Figure 17:
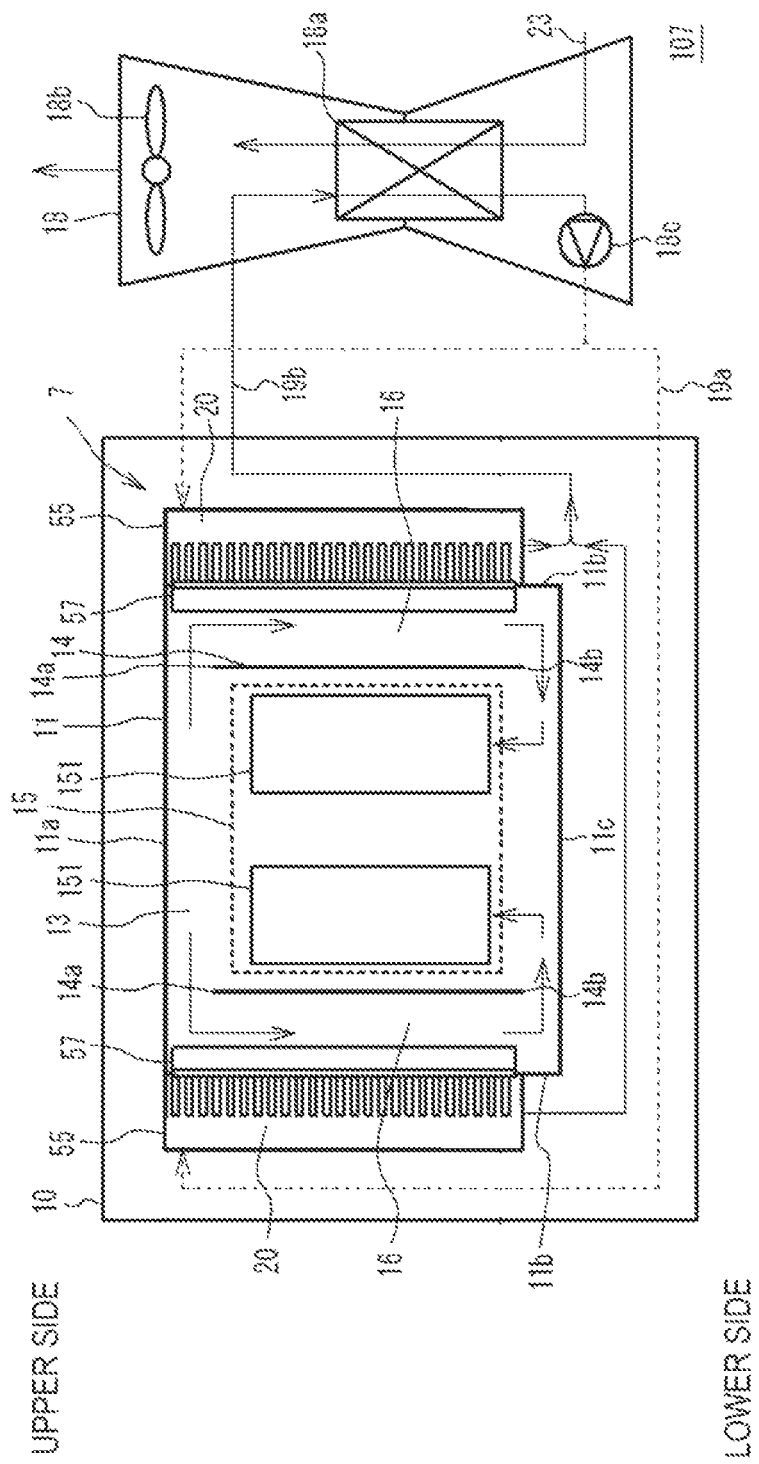
FIG. 17 schematically illustrates a configuration of a cooling system according to a ninth embodiment.

Next, referring to FIG. 17, a cooling system 107 and a cooling device 7 according to a ninth embodiment are described. According to the ninth embodiment, an outer tank 55 and heat sinks 57 are provided instead of the outer tank 12 and the heat sinks 17 according to the first embodiment. In the up-down direction, the dimensions of the outer tank 55 and the heat sinks 57 are larger than the dimensions of the outer tank 12 and the heat sinks 17 according to the first embodiment.

Accordingly, the outer tank 55 and the heat sinks 57 surround a large region of the inner tank 11 in the up-down direction. With such an outer tank 55 and heat sinks 57, the heat transfer area is able to be increased. This may improve the cooling efficiency. Since other elements are not different from those of the first embodiment, common elements are denoted by the same reference numerals in the drawings, and detailed description thereof is omitted.

Although the preferred embodiments according to the present disclosure have been described in detail above, the present disclosure is not limited to the specific embodiments, and various modifications and changes may be made within the scope of the gist of the present disclosure described in the claims.

According to an aspect of the embodiments, the amount of coolant used for an immersion cooling device may be reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling device comprising:
   an inner tank configured to store a first coolant which is a liquid;
   a separation wall that is provided in the inner tank, that faces a side wall portion of the inner tank, that forms an accommodating portion in which an electronic device to be immersed in the first coolant is accommodated, and that forms, at at least part of a periphery of the accommodating portion, a coolant channel through which the first coolant is to flow toward a lower side of the inner tank;
   an outer tank which is disposed outside the inner tank and through which a second coolant flows;
   a heat sink including an inner fin and an outer fin, and positioned at an upper side of the inner tank, the heat sink is configured to transfer heat from the first coolant to the second coolant; and
   a bottom plate that is disposed below the accommodating portion, that has an injection hole through which the first coolant having has flowed, through the coolant channel, to a region below the accommodating portion is injected toward the accommodating portion,
   the injection hole is tapered such that a diameter of the injection hole reduces from a lower surface side of the bottom plate to an upper surface side of the bottom plate, the inner fin has an area enlarged portion disposed in an upper portion of the inner fin, an upper edge portion of the separation wall has a guide plate portion inclined toward a central portion of the inner tank as the guide plate portion extends upward, and the area enlarged portion and the guide plate portion are opposed to one another so that a force of a flow of the first coolant is able to be further increased.

2. The cooling device according to claim 1, wherein the inner fin is disposed on an inside of the inner tank and the outer fin is disposed on an outside of the inner tank.

3. The cooling device according to claim 1, further comprising:

an external cooling unit configured to cool the second coolant, wherein the second coolant having been cooled by the external cooling unit is introduced into the outer tank at a position above a position where the second coolant is discharged from the outer tank.

4. A cooling system comprising:
an electronic device; and
a cooling device including:
an inner tank configured to store a first coolant which is a liquid;
a separation wall that is provided in the inner tank, that faces a side wall portion of the inner tank, that forms an accommodating portion in which the electronic device to be immersed in the first coolant is accommodated, that forms, at at least part of a periphery of the accommodating portion, a coolant channel through which the first coolant is to flow toward a lower side of the inner tank;
an outer tank which is disposed outside the inner tank and through which a second coolant flows;
a heat sink including an inner fin and an outer fin, and positioned at an upper side of the inner tank, the heat sink is configured to transfer heat from the first coolant to the second coolant; and
a bottom plate that is disposed below the accommodating portion, that has an injection hole through which the first coolant having has flowed, through the coolant channel, to a region below the accommodating portion is injected toward the accommodating portion,
the injection hole is tapered such that a diameter of the injection hole reduces from a lower surface side of the bottom plate to an upper surface side of the bottom plate,
the inner fin has an area enlarged portion disposed in an upper portion of the inner fin,
an upper edge portion of the separation wall has a guide plate portion inclined toward a central portion of the inner tank as the guide plate portion extends upward, and
the area enlarged portion and the guide plate portion are opposed to one another so that a force of a flow of the first coolant is able to be further increased.

5. A method of cooling an electronic device using a cooling device, the method comprising:

accommodating the electronic device in an accommodating portion formed in an inner tank of the cooling device, the electronic device being immersed in a first coolant stored in the inner tank, the accommodating portion being formed by a separation wall provided in the inner tank such that the separation wall faces a side wall portion of the inner tank;

heating the first coolant heated from heat generated by the electronic device, the heating causing;

an upward flow of the first coolant toward a lower side of the inner tank through a coolant channel formed at at least part of a periphery of the accommodating portion;

a downward flow of the first coolant to transfer the heat to a second coolant flowing in an outer tank of the cooling device, the heat being transferred by a heat sink positioned at an upper side of the inner tank and including an inner fin and an outer fin;

the first coolant that transferred the heat to flow toward a region below the accommodating portion;

the first coolant in the region below the accommodating portion to be drawn into the accommodating portion again, the cooling device including a bottom plate that is disposed below the accommodating portion, that has an injection hole through which the first coolant having has flowed, through the coolant channel, to the region below the accommodating portion is injected toward the accommodating portion, the injection hole is tapered such that a diameter of the injection hole reduces from a lower surface side of the bottom plate to an upper surface side of the bottom plate, the inner fin has an area enlarged portion disposed in an upper portion of the inner fin, an upper edge portion of the separation wall has a guide plate portion inclined toward a central portion of the inner tank as the guide plate portion extends upward, and the area enlarged portion and the guide plate portion are opposed to one another so that a force of a flow of the first coolant is able to be further increased.

\* \* \* \* \*